United States Patent [19]
Koyamao et al.

[11] Patent Number: 5,491,348
[45] Date of Patent: Feb. 13, 1996

[54] HIGHLY-ORIENTED DIAMOND FILM FIELD-EFFECT TRANSISTOR

[75] Inventors: Hisasi Koyamao; Koichi Miyata, both of Kobe; Kimitsugu Saito, Tarumi, all of Japan; David L. Dreifus; Brian R. Stoner, Raleigh, both of N.C.

[73] Assignee: Kobe Steel USA, Inc., Research Triangle Park, N.C.

[21] Appl. No.: 313,986

[22] Filed: Sep. 28, 1994

Related U.S. Application Data

[63] Continuation of Ser. No. 61,857, May 14, 1993, abandoned.

[51] Int. Cl.$^6$ .................................................. H01L 29/04
[52] U.S. Cl. ..................................... 257/66; 257/77
[58] Field of Search .............................. 257/77, 627, 64, 257/66

[56] References Cited

U.S. PATENT DOCUMENTS

| | | | |
|---|---|---|---|
| 4,670,968 | 6/1987 | Mikami et al. . | |
| 4,806,900 | 2/1989 | Fujimori et al. | 338/22 R |
| 5,066,938 | 11/1991 | Kobashi et al. | 338/22 SD |
| 5,086,014 | 2/1992 | Miyata et al. . | |
| 5,089,802 | 2/1992 | Yamazaki | 338/22 SD |
| 5,107,315 | 4/1992 | Kumagai et al. | 257/77 |
| 5,124,179 | 6/1992 | Garg et al. . | |
| 5,126,206 | 6/1992 | Garg et al. . | |
| 5,183,530 | 2/1993 | Yamazaki | 156/643 |
| 5,184,199 | 2/1993 | Fujii et al. | 257/77 |

(List continued on next page.)

FOREIGN PATENT DOCUMENTS

| | | |
|---|---|---|
| 421397A1 | 4/1991 | European Pat. Off. . |
| 445998A1 | 9/1991 | European Pat. Off. . |
| 59-27754 | 2/1984 | Japan . |
| 59-137396 | 8/1984 | Japan . |
| 60-12747 | 1/1985 | Japan . |
| 61-3320 | 1/1986 | Japan . |
| 61-251158 | 11/1986 | Japan . |
| 64-55862 | 3/1989 | Japan . |
| 64-68966 | 3/1989 | Japan . |
| 1158774 | 6/1989 | Japan . |
| 1244399 | 9/1989 | Japan . |
| 2273960 | 11/1990 | Japan . |
| 312966 | 1/1991 | Japan . |
| 394429 | 4/1991 | Japan . |
| 3110866 | 5/1991 | Japan . |
| 3120865 | 5/1991 | Japan . |
| 3160731 | 7/1991 | Japan . |
| 3263872 | 11/1991 | Japan . |
| 3278463 | 12/1991 | Japan . |
| 3278474 | 12/1991 | Japan . |
| 426161 | 1/1992 | Japan . |
| 426172 | 1/1992 | Japan . |
| 2243949 | 11/1991 | United Kingdom . |
| 2252202 | 7/1992 | United Kingdom . |

OTHER PUBLICATIONS

Geis, *Growth of textured diamond films on foreign substrates from attached seed crystals*, Appl. Phys. Lett., 55:550–552 (1989).

Primary Examiner—Sara W. Crane
Assistant Examiner—Courtney A. Bowers
Attorney, Agent, or Firm—Bell, Seltzer, Park & Gibson

[57] ABSTRACT

A source electrode is formed on the first semiconducting diamond film and a drain electrode is formed on the second semiconducting diamond film. A highly resistant diamond film having a thickness of between 10 Å and 1 mm and an electrical resistance of at least $10^2 \Omega$.cm or more is placed between the first and second semiconducting diamond films. A gate electrode is formed on the highly resistant diamond film. Thereby, a channel region is formed by these first and second semiconducting diamond films as well as the highly resistant diamond film. All or at least a part of said first and second semiconducting diamond films and the highly resistant diamond film are made of highly-oriented diamond films where either (100) or (111) crystal planes of diamond cover at least 80% of the film surface, and the differences $\{\Delta\alpha, \Delta\beta, \Delta\gamma\}$ of Euler angles $\{\alpha, \beta, \gamma\}$ which represent the crystal plane orientation, satisfy $|\Delta\alpha|<10°$, $|\Delta\beta|<10°$, $|\Delta\gamma|<10°$, simultaneously between adjacent crystal planes.

6 Claims, 9 Drawing Sheets

U.S. PATENT DOCUMENTS

| | | | |
|---|---|---|---|
| 5,221,411 | 6/1993 | Narayan | 156/603 |
| 5,236,545 | 8/1993 | Pryor | 156/613 |
| 5,278,430 | 1/1994 | Kakumu | 257/77 |
| 5,298,765 | 3/1994 | Nishimura | 257/77 |
| 5,341,063 | 8/1994 | Kumar | 257/77 |
| 5,371,383 | 12/1994 | Miyata et al. | 257/77 |
| 5,391,895 | 2/1995 | Dreifus | 257/77 |
| 5,420,443 | 5/1995 | Dreifus et al. | 257/77 |
| 5,424,561 | 6/1995 | Tachibana et al. | 257/77 |

BEFORE CONTACT

AFTER CONTACT

CURRENT COMPLETELY INTERCEPTED

CURRENT SLIGHTLY FLOWS

LARGE CURRENT FLOWS BY INJECTION BY CARRIER

STANDARD ORIENTATION
OF CRYSTAL PLANE

SURFACE STRUCTURE OF A HIGHLY ORIENTED
DIAMOND FILM WITH THE (100) CRYSTAL PLANE 5,491,348

HIGHLY-ORIENTED DIAMOND FILM FIELD-EFFECT TRANSISTOR

This is a continuation of application Ser. No. 08/061,857 filed on 14 May 1993, now abandoned.

BACKGROUND OF THE INVENTION

1. Field of the Invention

The present invention relates to a diamond field-effect transistor which is useful for high-temperature, high-power and high-frequency electronic devices, more particularly to a highly-oriented diamond film field-effect transistor (FET) utilizing highly-oriented diamond films which have characteristics similar to single crystal diamond.

2. Prior Art

Diamond has excellent characteristics such as high thermal conductivity (20 W/cm.K), large band gap (5.5 eV) and high electron and hole mobilities (electron: 2000 $cm^2$/V.s, hole: 2100 $cm^2$/V.s), and therefore diamond is expected to be used in various fields such as electric devices which are operative under high temperature and irradiation, high-power and high-frequency devices and the like.

FIG. 1 shows a prior art field-effect transistor utilizing a diamond film. The FET shown in FIG. 1 is a metal-semiconductor junction type field-effect transistor (MESFET) (Japanese under Provisional Publication hei 3-94429) illustrating depositing a P-type semiconducting diamond film 42 on a diamond substrate 41 as a channel layer and subsequently forming each of a source electrode 43 comprising a Au/Mo/Ti multilayer, a gate electrode 44 comprising Al and a drain electrode 45 comprising a Au/Mo/Ti multilayer on the P-type semiconducting diamond film 42.

The source-drain characteristics of this MESFET are shown in FIG. 2, where the drain current is plotted versus the drain voltage. In FIG. 2, $V_g$ indicates the voltage applied to the gate electrode 44. By applying the positive bias to the gate, the source-drain current is controlled as shown in FIG. 2 (H. Shiomi, Y. Nishibayashi and N. Fujimori, Jpn. J. Appl. Phys., Vol. 29, No. 12, page L2153, 1989).

In order to reduce the leakage current from the gate electrode in the MESFET, a metal-intrinsic semiconductor FET (MISFET) has been proposed (Japanese under Provisional Publication hei 1-158774) in which an insulating diamond layer 46 is inserted between a channel layer 42 made of a semiconducting diamond film and the gate metal electrode 44 as shown in FIG. 3A. This MISFET device shows the FET response as shown in FIG. 3B (N. Fujimori and Y. Nishibayashi, Diamond and Related Materials, Vol. 1, P665 (1992)). FIG. 3B is a graph showing the source-drain characteristics of the drain current versus the drain voltage. In FIG. 3B, $V_g$ also indicates the gate bias.

Also, in Japanese under Provisional Publication hei 3-263872, in order to reduce the leakage current from the gate electrode, a field-effect transistor having a MIS structure has been proposed as shown in FIGS. 4A and 4B.

FIG. 4B is a plan view showing this device. FIG. 4A is a cross sectional view showing the enlarged region between A and B of FIG. 4B.

These electrodes are provided so as to enclose a circular drain electrode 57 with a ring-shape gate electrode 55 and to further enclose the gate electrode with a source electrode 56. The drain electrode 57 and the source electrode 56 consist of Au/Ti bilayer films and the gate electrode 55 consists of an Al film.

In this FET, an undoped insulating diamond film 52 is formed on a $Si_3N_4$ substrate 51 and a B-doped P-type diamond film 53 is formed on the undoped diamond film 52. The gate electrode 55 is formed on the B-doped diamond film 53 through an insulating diamond film 54 and the source electrode 56 and the drain electrode 57 are formed directly on the B-doped diamond film 53.

As mentioned above, the MIS structure comprising the Al gate electrode 55, the undoped insulating diamond film 54 and the B-doped semiconducting diamond film 53 is formed in the gate region.

FIG. 5 shows the current-voltage characteristics of this field-effect transistor (Nishimura, Kato, Miyauchi and Kobashi, The Proceedings of The 5th Symposium on Diamond, p 31, 1991). In FIG. 5, the x-axis indicates the drain voltage (V) and the y-axis the drain current (μA). FIG. 5 shows the field-effect characteristics of the diamond FET shown in FIGS. 4A and 4B.

In Japanese under Provisional Publication hei 3-12966, a FET having an insulating layer 64 inserted between a P-type semiconducting film 62, formed on a substrate 61, and a gate electrode 65 has been proposed as shown in FIG. 6. A numeral 63 is a drain electrode and 66 is a source electrode. The P-type semiconducting film 62 is a B-doped diamond film. The insulating layer 64 is made of silicon oxide.

FIGS. 7A and 7B show the source-drain characteristics of the FET utilizing $SiO_2$ for this insulating layer 64 (A. J. Tessmer, K. Das and D. L. Dreifus, Diamond and Related Materials, Vol. 1, p. 89, 1992; G. G. Fountain et al., Diamond Materials, p. 523, The Electrochemical Society 1991).

Although modulation of the drain current by the gate bias can be seen in the prior art FETs utilizing diamond, no FET, which has sufficient pinch-off and saturation characteristics to be practical, has been realized yet.

One reason for this is that the leakage current from the gate electrode increases when positive bias was applied to the gate electrode. Therefore, a sufficient depth of the depletion layer is not generated in the P-type semiconducting channel diamond layer. In order to generate the depletion layer in the entire P-type channel layer, it is necessary to reduce the doping concentration or to make the channel layer very thin. However, it is very difficult to form a thin P-type channel layer with good reproductivity by chemical vapor deposition. Further, there is a defect that, if the doping concentration is reduced, the resistance between the source and drain electrodes increases and therefore it is difficult to obtain high FET characteristics.

FETs can be fabricated on a single crystal diamond substrate. However, it is very difficult to form many devices on the substrate since a single crystal diamond substrate typically has a very small surface area, FETs can also be fabricated on a diamond film deposited on non-diamond substrates such as silicon wafers. However, in this case, the diamond film is polycrystalline so that the carrier mobilities are very small due to the existence of grain boundaries. Therefore, the transistor characteristics are usually very poor.

SUMMARY OF THE INVENTION

It is an object of the present invention to provide a diamond field-effect transistor having a high transconductance, an ideal current-voltage characteristic of a transistor, as well as high carrier mobilities by decreasing grain boundaries and surface roughness.

A highly-oriented diamond film field-effect transistor according to the present invention comprises a source electrode, a drain electrode, a gate electrode, a first semiconducting diamond film connected to said source electrode, a second semiconducting diamond film connected to said drain electrode, and a highly resistant diamond film with a thickness of between 10 Å to 1 mm and an electric resistance of $10^2$ Ω.cm or more, to which the gate electrode is attached, between said first and second semiconducting diamond films. Thus, a channel region consists of the first and second semiconducting diamond films, and the highly resistant diamond film in between. At least a part of said first and second semiconducting diamond films and said highly resistant diamond film is made of highly-oriented diamond film.

At least 80% of the surface of said highly-oriented diamond film consists of either (100) or (111) crystal planes. In the adjacent crystals with either (100) or (111) crystal planes, the differences $\{\Delta\alpha, \Delta\beta, \Delta\gamma\}$ of the Euler angles associated with each of the orientations of the crystal planes, satisfy $|\Delta\alpha|\leq 10°$, $|\Delta\beta|\leq 10°$ and $|\Delta\gamma|\leq 10°$ simultaneously between adjacent crystal planes.

FIGS. 12A and 12B show diagrammatically the surface structure of a diamond film of the present invention wherein the (100) crystal planes are highly oriented according to this invention. This diagram defines the x-axis and the y-axis which cross at right angles to each other in a film surface, and the z-axis in the direction normal to the film surface. The Euler angles indicating the orientations of crystal planes of the (i)th diamond crystal and the adjacent (j)th diamond crystal are defined by $\{\alpha_i, \beta_i, \gamma_i\}$ and $\{\alpha_j, \beta_j, \gamma_j\}$, respectively, and the angle differences between the two are defined by $\{\Delta\alpha, \Delta\beta, \Delta\gamma\}$.

The Euler angles $\{\alpha, \beta, \gamma\}$ indicate the orientation of the crystal plane that can be attained by rotating the standard crystal plane around the standard coordinates of axis x, y and z by the angles $\alpha$, $\beta$ and $\gamma$ one after another.

According to this invention, the highly oriented diamond film satisfies ($|\Delta\alpha|\leq 10°$, $|\Delta\beta|\leq 10°$ and $|\Delta\gamma|\leq 10°$) simultaneously. It therefore follows that the crystals are oriented to a high degree and that the carrier mobilities are as high as those of a homoepitaxial diamond film.

For the case of crystals with (111) crystal planes, the crystals are highly oriented as well and the carrier mobilities become high when all the absolute values of the differences in Euler angles are below 10°. Such a highly-oriented diamond film can be grown, for instance, by subjecting a silicon substrate to a microwave irradiation while applying a negative bias in the gas phase containing methane.

The electrical resistance (specific resistance) of the highly resistant diamond film is, for example, $10^2$ Ω.cm or more. Preferably, a non-diamond insulating layer is provided between the gate electrode and highly resistant diamond film. Such an insulating layer can be formed of at least one component selected from the group consisting of silicon oxides, silicon nitrides, aluminum oxides, aluminum nitride and zirconium oxides.

FIGS. 8A and 8B are diagrams showing the operation of a prior art FET shown in FIG. 4A; FIG. 8A shows the distribution of drain current (carrier) when the gate bias is not applied and FIG. 8B shows the distribution of drain current when the gate bias is applied.

As shown in FIGS. 8A and 8B, the electric current is controlled by expanding the depletion layer 47 in the channel layer 42 through which the carrier current flows in the FET of prior art. In this case, the electric current $I_D$ from the source electrode 43 to the drain electrode 45 passes only through the semiconducting channel layer 42.

On the other hand, FIG. 9 is a diagram showing the operating principle of the diamond FET according to the present invention. The channel layer 7 consists of the first semiconducting diamond film 1, the second semiconducting diamond film 3 and the highly resistant diamond film 2 inserted between the two films. The source electrode 4, the drain electrode 6 and the gate electrode 5 are provided on the first semiconducting diamond film 1, the second semiconducting diamond film 3, and the highly resistant diamond film 2, respectively.

In the present invention, carriers from the source electrode 4 flow through the semiconducting diamond film 1, the highly resistant diamond film 2, then the semiconducting diamond film 3 and reach the drain electrode 6. By changing the voltage $V_G$ applied to the gate electrode 5, the electric potential in the highly resistant film 2 can be changed so as to control the carrier injection from the semiconducting diamond film 1 to the highly resistant diamond film 2.

In the FET having this structure, since it is not necessary to expand the depletion layer in the channel layer 7, the problem associated with the leakage current produced at the gate electrode 5 in the prior art FET does not exist, and the thin and continuous diamond channel layer with a low doping concentration is not required.

The operating principle of the diamond FET according to the present invention will be explained, referring to the semiconducting energy band diagrams shown in FIGS. 10A, 10B and 11A to 11C. These diagrams represent the energy bands of the transistor shown in FIG. 9.

FIG. 10A shows the band structure for, from the left to the right, the P-type semiconducting diamond film 1 (the source part in the channel layer), the highly resistant diamond film 2 (the gate part) and the P-type semiconducting diamond film 3 (the drain part), respectively, before contact. Once these diamond layers are in contact with each other, the energy band structure shown in FIG. 10B is achieved at the thermal equilibrium state.

As shown in FIG. 11A, when a negative drain voltage $V_D$ is applied to the drain (the semiconducting diamond film with respect to the source (the semiconducting diamond film 1) and a positive gate bias $V_G$ is applied to the gate (the highly resistant diamond film 2) with respect to the source, the highly resistant diamond film 2 becomes a potential barrier for the carriers (holes in this case) existing in the source region, and therefore the drain current $I_D$ does not flow.

As shown in FIG. 11B, however, if the positive bias $V_G$ applied to the gate is decreased while the source-drain voltage $V_D$ is kept constant, the carriers existing in the P-type semiconducting layer of the source region gradually flow into the highly resistant diamond layer 2 due to the lowered potential barrier. The high energy carriers exceeding the peak potential flow into the drain electrode due to the strong electric field existing between the gate and the drain.

Furthermore, if the gate bias $V_G$ in the highly resistant diamond film 2 becomes negative with respect to the source, the potential barrier of the gate disappears as shown in FIG. 11c. Therefore, a large current $I_D$ flows from the source to the drain through the highly resistant diamond layer 2. In conclusion, the drain current $I_D$ can be controlled by changing the bias $V_G$ applying to the gate and therefore transistor characteristics can be obtained.

The thickness of the highly-resistant diamond film 2 must be between 10 Å and 1 mm. If the highly resistant diamond film 2 is thinner than 10 Å, the drain current $I_D$ can not be controlled by the gate bias $V_G$ because of the tunneling current. On the other hand, if the highly resistant diamond film 2 is thicker than 1 mm, the source-drain current $I_D$ does not flow either because carriers cannot travel such a long distance.

Preferably, the specific resistance of the highly resistant diamond film 2 is at least $10^2$ Ω.cm or more. If the specific resistance is less than $10^2$ Ω.cm, an unwanted current flows from the source electrode 4 to the gate electrode 5.

By inserting an insulating layer between the gate electrode 5 and the highly resistant diamond layer 2, a higher bias can be applied to the gate electrode 5.

Furthermore, in the present invention, a highly-oriented diamond film is used in which at least 80% of the area of the synthesized diamond film is covered with either (100) or (111) crystal planes. Since the crystal planes of the same kind grow at the same rate, if a diamond film is synthesized for a prolonged period, the irregularity of the resulting film surface will either disappear or be significantly decreased as compared with that of prior art polycrystalline diamond films. As the film keeps growing, the gap between said crystal planes becomes smaller, and consequently the two adjacent crystals will be in contact with or overlap each other and the film surface will be totally covered with the same kind of crystal planes.

Although the highly-oriented diamond film as shown in FIGS. 12A and 12B still contains grain boundaries between diamond crystal grains, the misorientations between crystal planes is small, which results in a significantly lower carrier scattering compared to the prior art polycrystalline diamond films. The carrier trapping is also decreased due to the decrease of defects present in grain boundaries. For these reasons, the electrical characteristics of the highly-oriented diamond film are substantially improved compared to the prior art polycrystalline films. That is, by using these highly-oriented diamond films for FETs, it is possible to greatly improve FET characteristics.

Such improvements of FET characteristics can be achieved by restricting the coverage of diamond film to the given condition and the angle differences |Δα|, |Δβ|, |Δγ| to below the given values. Any oriented diamond films which do not meet these conditions have poorer electrical characteristics.

A further advantage of the highly-oriented diamond films according to the present invention is that there is no limitation of surface area unlike single crystal diamond because the highly-oriented diamond films can be deposited on silicon wafers and a like which have the surface area of several inches in diameter.

Another advantage of the highly-oriented diamond films according to the present invention is that the carrier mobilities are more than 100 times better compared with the carrier mobilities of the prior art polycrystalline films, since the carrier scattering and the carrier trapping at grain boundaries are minimized as mentioned above. Therefore, FETs comprising highly oriented diamond films provide a significant improvement of its characteristics compared with the FET characteristics utilizing the prior art polycrystalline diamond films.

The highly-oriented diamond film may be used for only the first or the second semiconducting diamond film, or for the highly resistant diamond film or for a part of these films or layers.

Some references covering the synthesis of oriented diamond grains are available (for example, B. R. Stoner and J. T. Glass, Applied Physics Letters, Vol. 60, No. 6, p. 698, 1992). In the prior art, however, only as much as 50% of grains are oriented. This accounts for the poor electrical characteristics of the films produced by the prior art unlike the highly-oriented diamond film according to the present invention.

BRIEF DESCRIPTION OF THE DRAWINGS

FIG. 4A shows its cross sectional view, while FIG. 4B shows its plan view;

FIG. 12A shows the standard orientation of crystalline plane, while FIG. 12B shows the surface structure of the highly-oriented diamond film with (100) crystal planes;

DETAILED DESCRIPTION OF THE PREFERRED EMBODIMENTS

Figure 1:
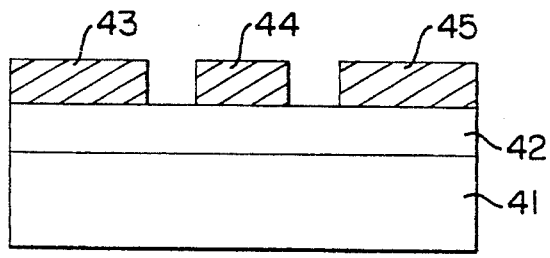
FIG. 1 is a cross sectional view showing a first prior art diamond FET.
Figure 2:
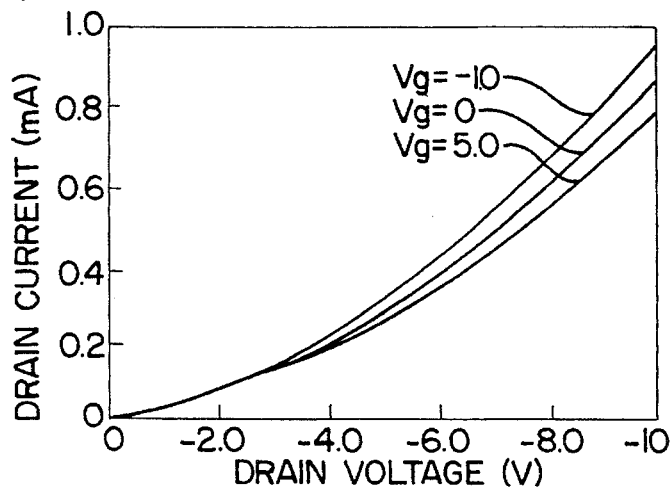
FIG. 2 is a graph showing the drain current-drain voltage characteristics of the first prior art diamond FET.
Figure 3A:
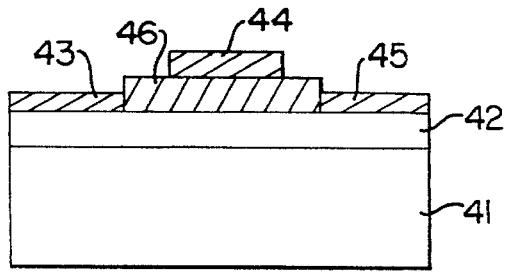
FIG. 3A is a cross sectional view showing the second prior art diamond FET.
Figure 3B:
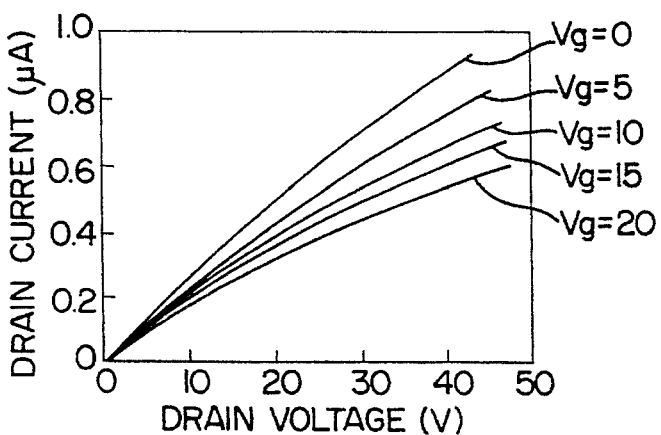
FIG. 3B is a graph showing the drain current-drain voltage characteristics of said second prior art diamond FET.
Figure 4A:
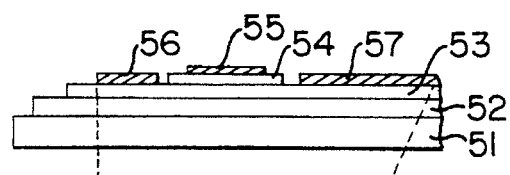
FIGS. 4A and 4B are diagrams showing the third prior art diamond FET.
Figure 4B:
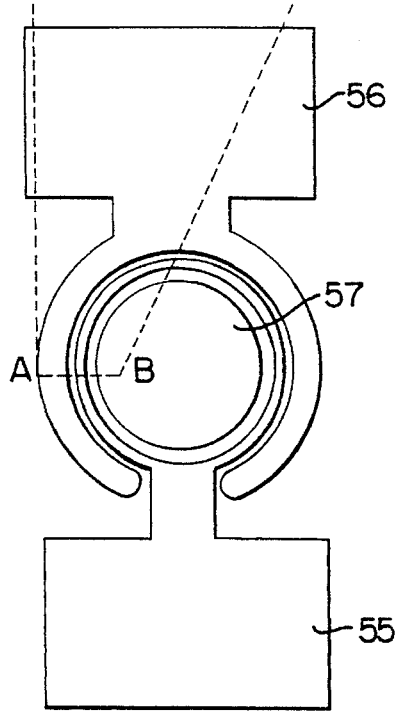
Figure 6:
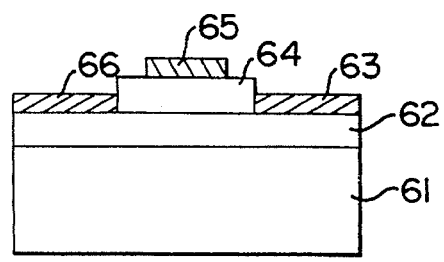
FIG. 6 is a sectional view of the fourth prior art diamond FET.
Figure 5:
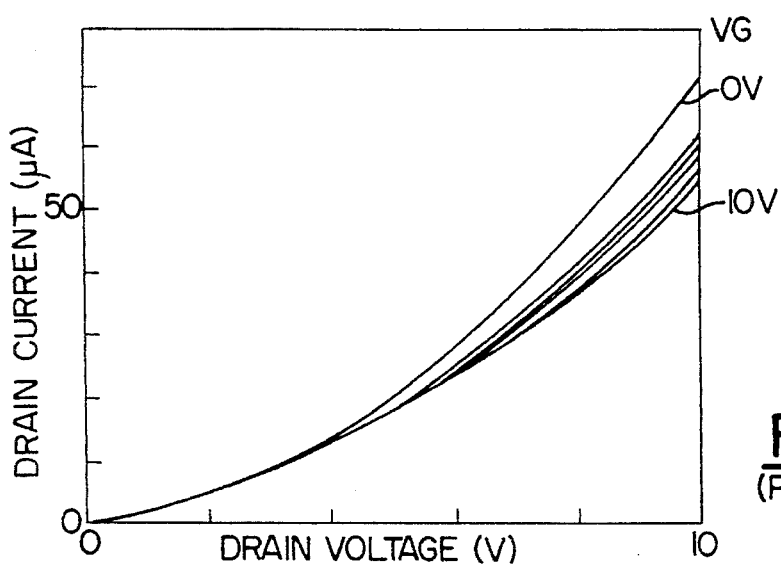
FIG. 5 is a graph showing the drain current-drain voltage characteristics of the third prior art diamond FET shown in FIGS. 4A and 4B.
Figure 7A:
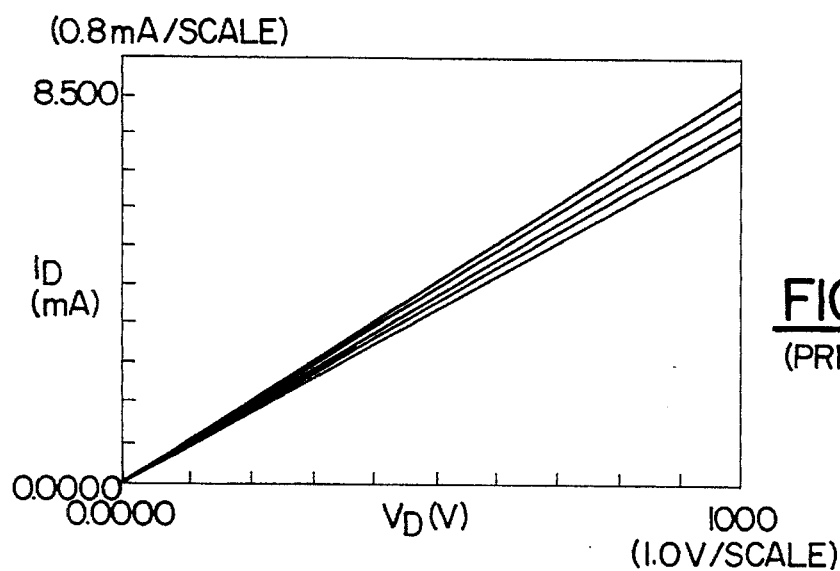
FIGS. 7A and 7B are graphs showing the drain current-drain voltage characteristics of the fourth prior art diamond FET shown in FIG. 6.
Figure 7B:
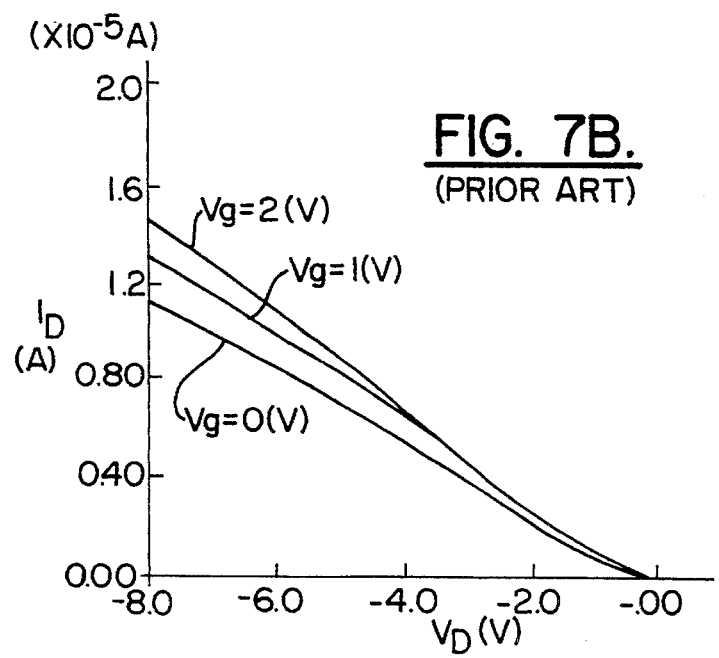
Figure 8A:
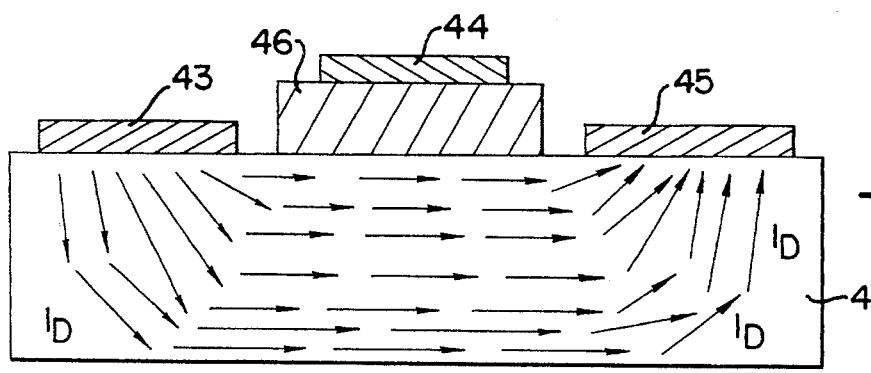
FIGS. 8A and 8B are cross sectional views showing the operating principle of the prior art diamond FET.
Figure 8B:
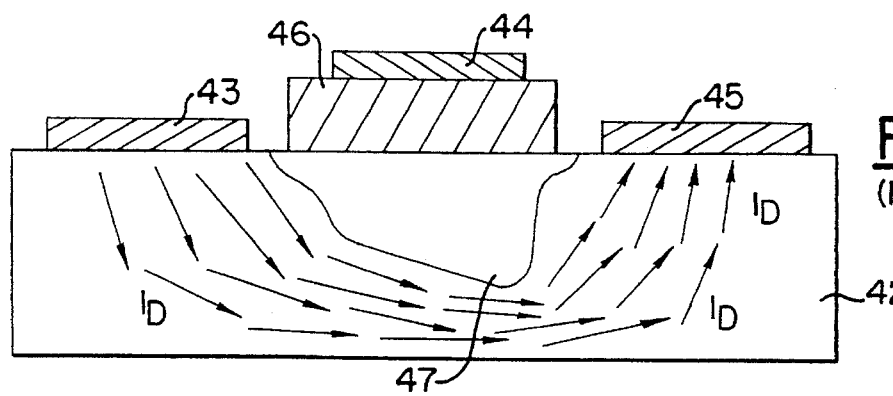
Figure 9:
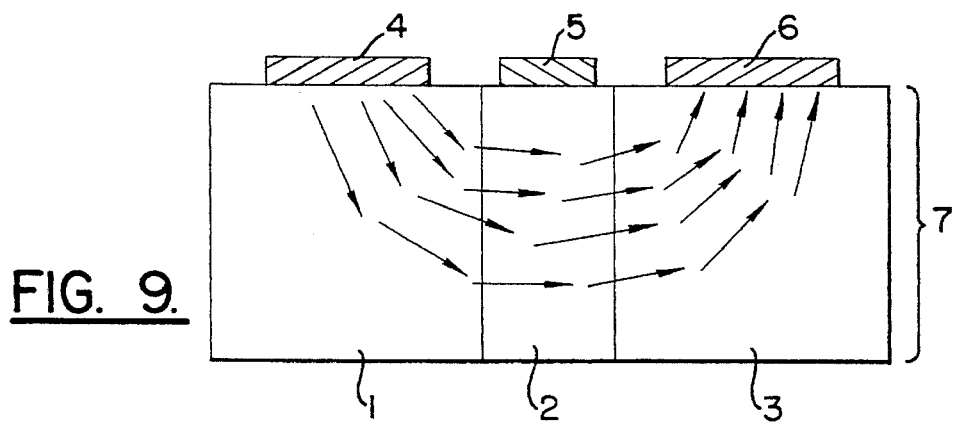
FIG. 9 is a diagram showing the principle of the present invention.
Figure 10A:
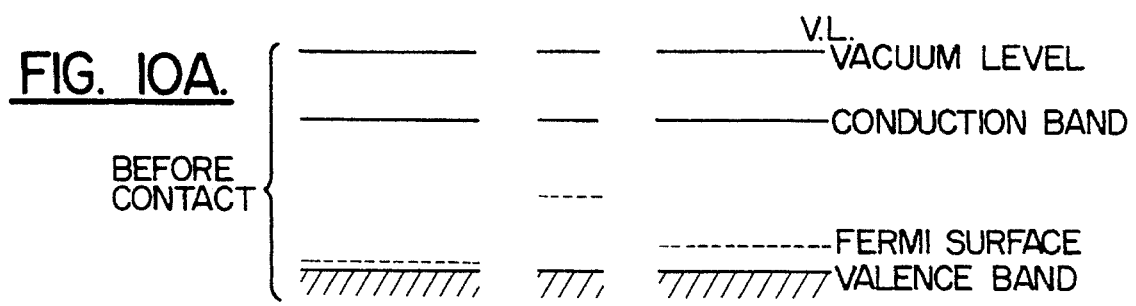
FIGS. 10A and 10B are diagrams showing the energy band diagrams, illustrating the principle of the present invention.
Figure 10B:
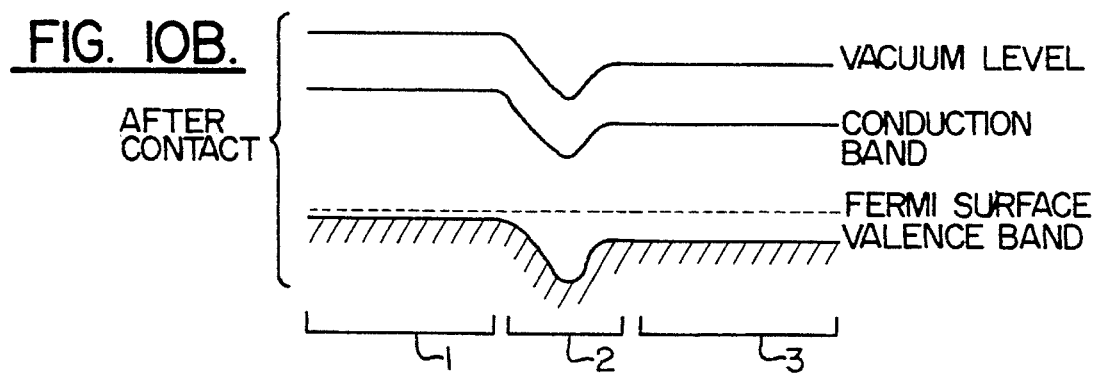
Figures 11A, 11B, 11C:
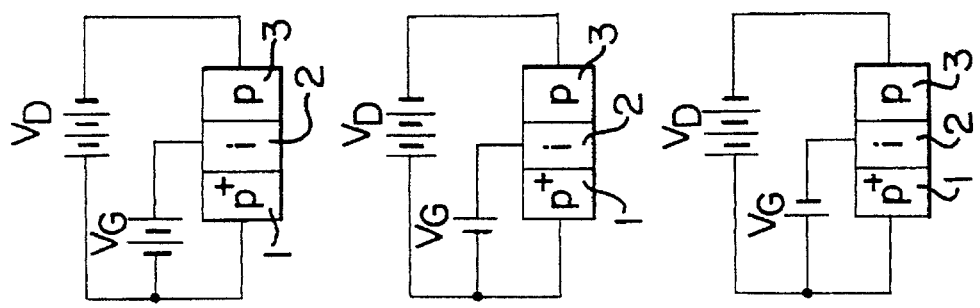
FIGS. 11A to 11c are diagrams showing the energy band diagrams, illustrating the operating principle of the present invention.
Figure 12A:
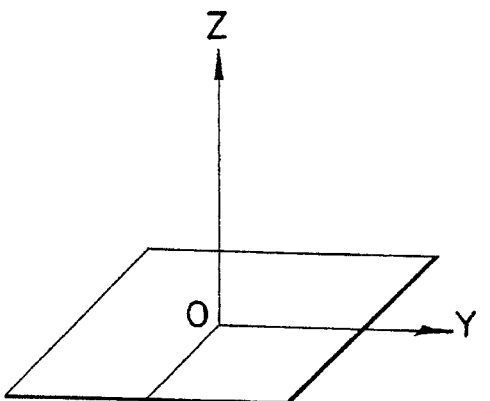
FIGS. 12A and 12B are diagrams showing the relationship between the surface structure of the highly-oriented diamond film and the Euler angles.
Figure 12B:
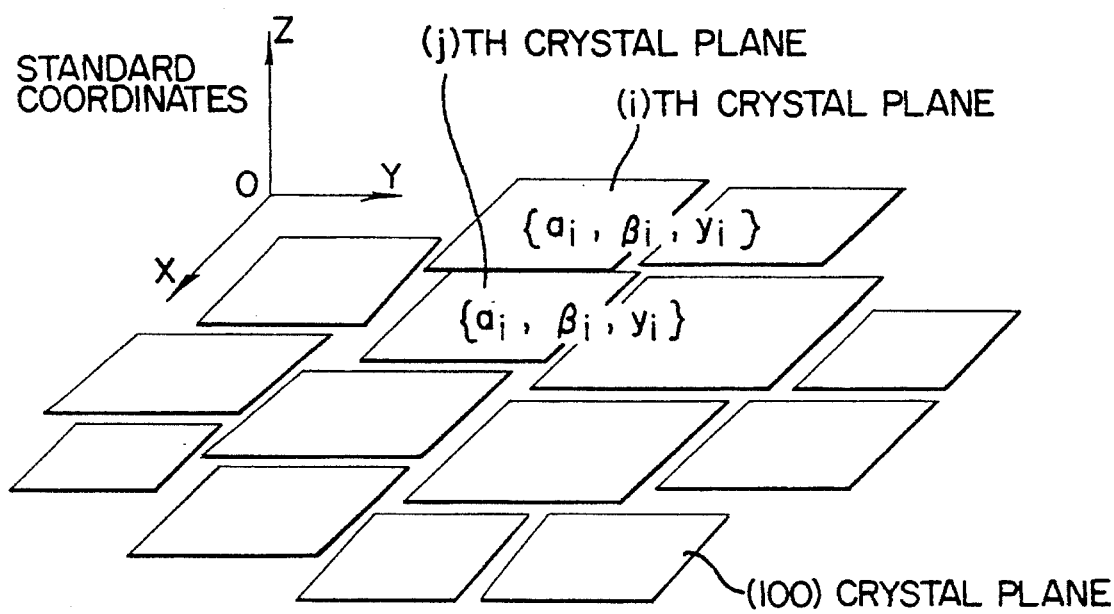
Figure 13:
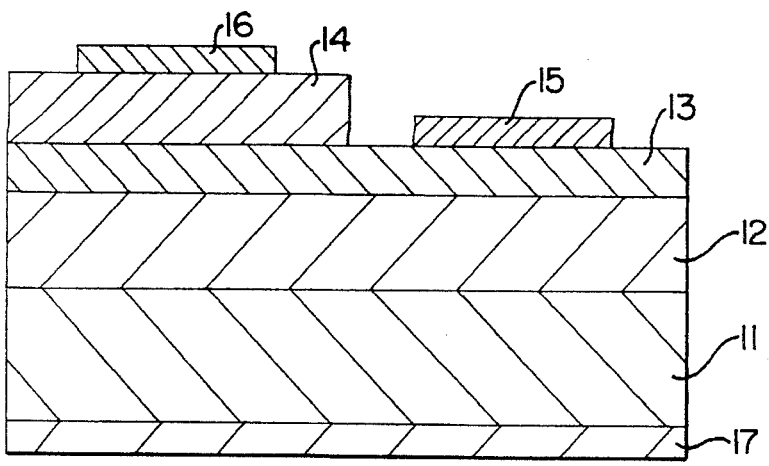
FIG. 13 is a cross sectional view showing the highly-oriented diamond film FET according to the first embodiment of the present invention.

A highly-oriented diamond FET according to the embodiment of the present invention was manufactured and its characteristics were evaluated. The results of evaluations will be explained as follows:

FIG. 13 shows the structure of a diamond FET according to a first embodiment of the present invention. A B-doped P-type semiconducting highly-oriented diamond film 12 was deposited 5 μm thick on a conducting substrate 11 (Si(100) with a specific resistance 0.01 Ω.cm or less). The deposition was conducted in a microwave chemical vapor deposition chamber under the following conditions: the source gas was 3% methane and 97% hydrogen, the gas pressure was 25 Torr, the gas flow rate was 300 ml/min, the substrate temperature was 700° C., and the deposition time was 15 minutes. A power source of about 1000 W was used to generate microwave energy, but the power was slightly adjusted so as to maintain the constant substrate temperature at 700° C. At the same time, a negative bias was applied to the substrate; the negative biasing current was 10 mA/cm$^2$.

Subsequently, the semiconducting diamond film deposition was continued for 20 hours under the following conditions: the source gas was 0.5% methane, 99.5% hydrogen and 0.5 ppm $B_2H_6$ as a doping gas (B/C ratio in gas is 200 ppm), the gas pressure was 30 Torr, the gas flow rate was 300 ml/min, the substrate temperature was 800° C.

Then, a 0.2 μm thick insulating diamond film 13 was laminated on a B-doped P-type semiconducting diamond 12 under the following conditions: the source gas was 0.5% methane, 99.4% hydrogen and 0.1% oxygen, the gas pressure was 30 Torr, the gas flow rate was 300 ml/min, the substrate temperature was 800° C., and the deposition time was 1 hour.

Subsequently, a B-doped P-type semiconducting diamond layer 14 of 5 μm thickness was deposited on the insulating diamond layer 13 by using a selective deposition technique for 20 hours under the following conditions: the source gas was 0.5% methane, 99.5% hydrogen and 5 ppm $B_2H_6$ as doping gas (B/C ratio in gas is 2000 ppm), the gas pressure was 30 Torr, the gas flow rate was 300 ml/min, the substrate temperature was 800° C.

Then, an Au electrode 16 was formed on the P-type diamond film 14 by a sputtering method and an Al electrode 15 was formed on the insulating diamond film 13 by an electron beam deposition technique. An Ag paste electrode 17 was formed on the lower surface of the conducting Si substrate 11. Using the Ag paste 17 as the drain electrode, the Al electrode 15 as the gate electrode, and the Au electrode 16 as the source electrode, a FET having the channel structure shown in FIG. 13 was fabricated.

As a reference, a FET which has a similar structure was fabricated using the prior art polycrystalline diamond films.

Figure 14:
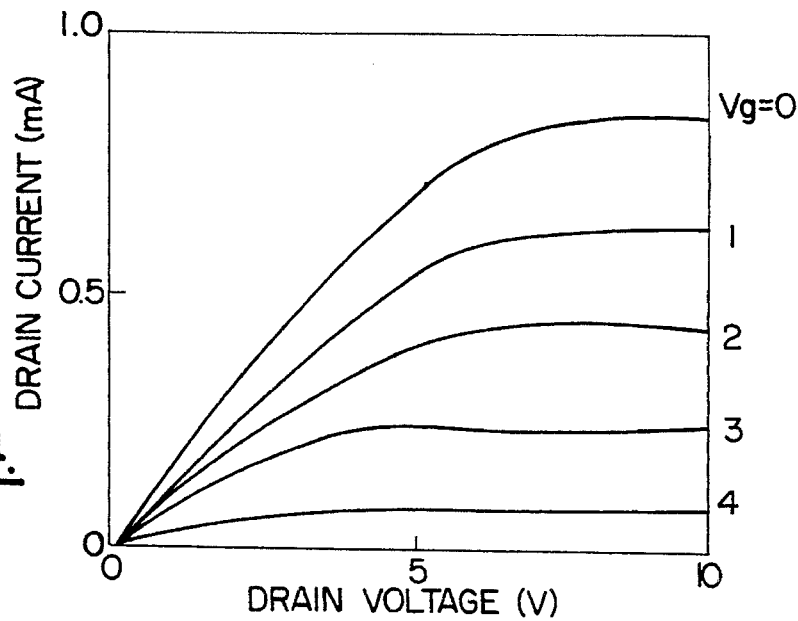
FIG. 14 is a graph showing the drain current-drain voltage characteristics of the diamond FET according to the first embodiment shown in FIG. 13.

The electrical characteristics of the FET prepared according to the example and the comparative example have been evaluated. FIG. 14 shows the drain current-drain voltage characteristics, obtained by changing the gate bias $V_G$ for the FET according to the example of the present invention having the structure shown in FIG. 13.

FIG. 14 clearly shows that the transistor shown in FIG. 13 has good FET characteristics.

Figure 15:
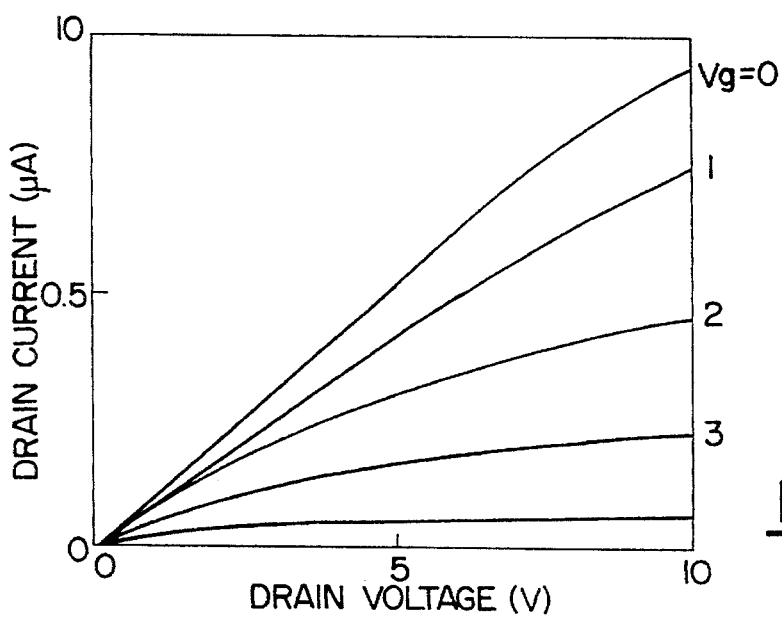
FIG. 15 is a graph showing the drain current-drain voltage characteristics of a reference diamond FET having the same structure as the first embodiment shown in FIG. 13, but constructed of polycrystalline diamond films.

On the other hand, FIG. 15 shows the drain current-drain voltage characteristics, obtained changing the gate bias $V_G$, for the FET of the comparative example having the same structure shown in FIG. 13, but utilizing polycrystalline diamond films. Although FET characteristics were attained, the drain current was small and the saturation characteristics were not achieved. On the contrary, in the example of the present invention, a large drain voltage was obtained and the saturation characteristics and better transistor characteristics were achieved.

Figure 16:
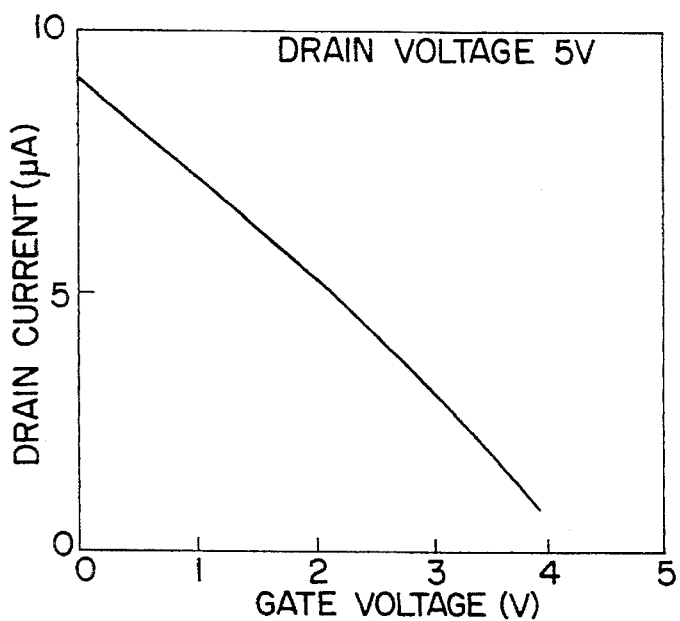
FIG. 16 is a graph showing the drain current-gate voltage characteristics of the first embodiment.
Figure 17:
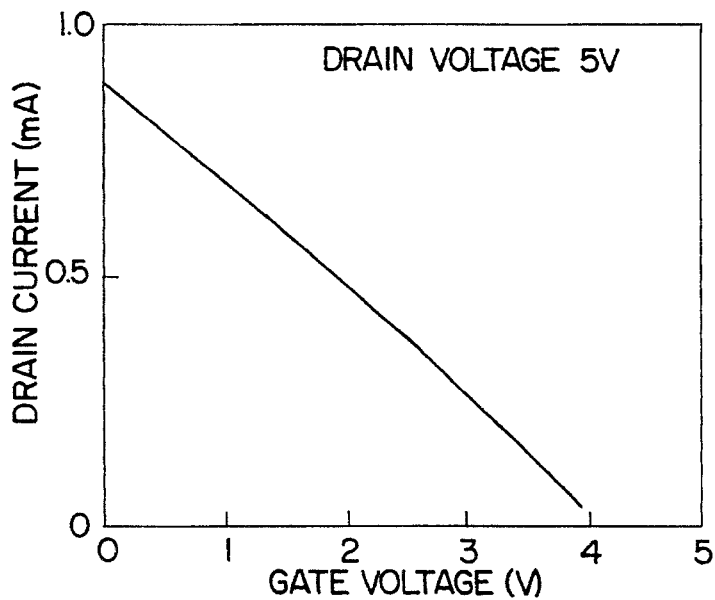
FIG. 17 is a graph showing the drain current-gate voltage characteristics of the reference.

A drain current-gate voltage characteristics, obtained at 5 V of the drain bias, is shown in FIG. 16 for the example of the present invention. A similar result is shown in FIG. 17 for the comparative example. As shown in FIG. 16, the example of the present invention showed a very large normalized transconductance $g_m$ value of 2 mS/mm the channel width of 100 μm. On the other hand, the $g_m$ value of the comparative example was 20 μS/mm.

Figure 18:
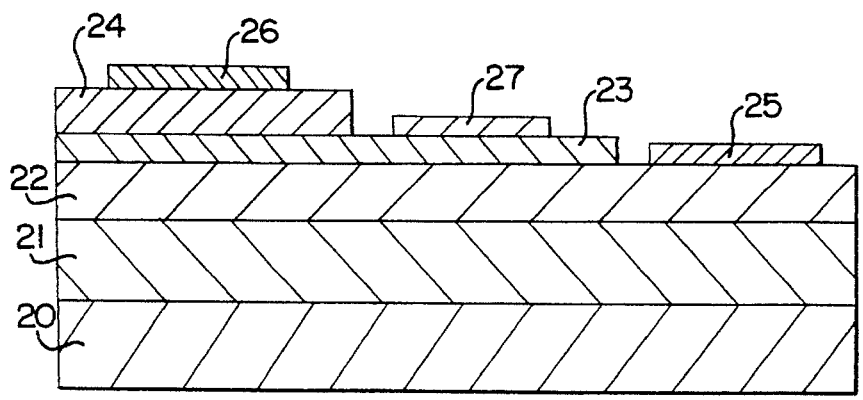
FIG. 18 is a cross sectional view showing the highly-oriented diamond film FET according to the second embodiment of the present invention.

The second embodiment of the present invention will be described as follows. As shown in FIG. 18, a 1 inch silicon wafer 20 of (100) cut, was placed in a microwave chemical vapor deposition chamber and treated for 15 minutes under the following conditions: the source gas was 3% methane, and 97% hydrogen, the gas pressure was 25 Torr, the gas flow rate was 300 ml/min and the substrate temperature was 700° C. The power source of about 1000 W was used to generate microwave energy, but the power was slightly adjusted so as to maintain the constant substrate temperature at 700° C. At the same time, a negative bias was applied to the substrate. The negative biasing current was 10 mA/cm$^2$.

Subsequently, the diamond film deposition was continued for 80 hours under the following conditions: the source the gas was 0.5% methane, 99.4% hydrogen and 0.1% oxygen, the gas pressure was 30 Torr, the gas flow rate was 300 ml/min, and the substrate temperature was 800° C. As a result, a highly-oriented diamond film 21 with about 20 μm thickness was deposited on the substrate 20.

Then, this substrate was cut into a piece of 2 cm×1 cm on which a B-doped P-type diamond film 22 was grown epitaxially up to a 1 μm thickness. In the film growth 0.5% methane diluted with hydrogen was used further as a source gas. As the doping gas, $B_2H_6$ was added to the source gas so that the B/C ratio in gas became 200 ppm. The gas pressure was 35 Torr and the substrate temperature was 800° C.

Then, an undoped diamond film 23 with 0.1 μm thickness was selectively deposited on the B-doped P-type diamond film 22. The deposition conditions for the undoped diamond film 23 were the same as for the B-doped diamond film 22 except that $B_2H_6$ was not added.

Next, a B-doped P-type diamond film 24 was selectively deposited on the undoped diamond film 23 up to a 1 μm thickness. The growth conditions were the same as for the P-type diamond film 22 except that the B/C ratio in the gas was 2000 ppm.

Then, Au electrodes were deposited on the P-type diamond films 22 and 24 as a drain electrode 25 and a source electrode 26, respectively, by a sputtering method, and an Al electrode was deposited on the undoped diamond film 23 as the gate electrode 27 by an electron beam deposition method.

Figure 19:
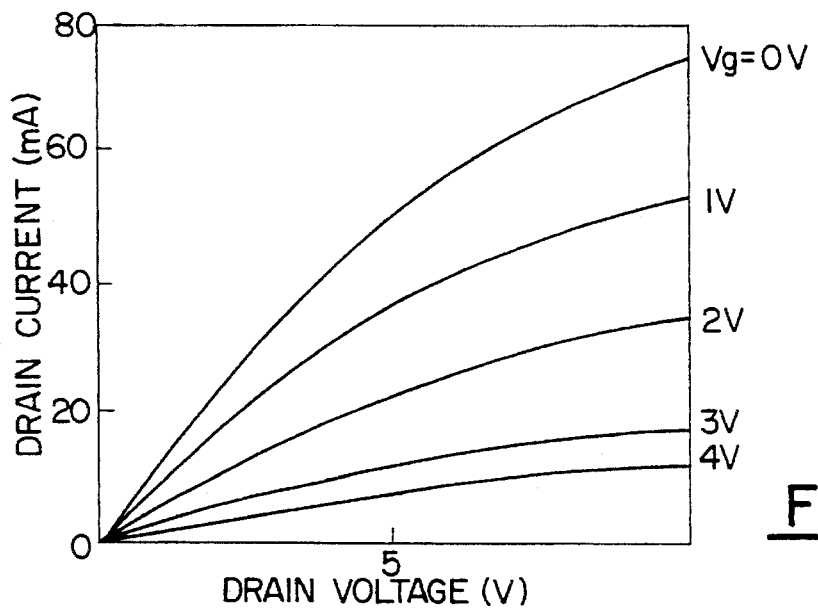
FIG. 19 is a graph showing the drain current-drain voltage characteristics of the second embodiment shown in FIG. 18.

The FET characteristics of the fabricated transistor are shown in FIG. 19. It is obvious from FIG. 19 that the highly-oriented diamond film FET has excellent electrical characteristics. The normalized transconductance $g_m$ was 0.2 mS/mm for 100 μm of the channel width.

The third embodiment of the present invention will be explained as follows: The FET structure according to this embodiment is similar to the second embodiment shown in FIG. 18. The manufacturing process of the FET according to this third embodiment is as follows:

Step 1

A 1" silicon wafer of (100) cut was used as a substrate to deposit a highly-oriented diamond film thereon. The substrate was placed in a chamber for microwave chemical vapor deposition and treated for 15 minutes under the following conditions: the source gas was 3% methane, 97% hydrogen, the gas pressure was 25 Torr, the gas flow rate was 300 ml/min and the substrate temperature was 700° C. The power source of about 1000 W was used to generate microwave energy, but the power was slightly adjusted so as to maintain the constant substrate temperature at 700° C. At the same time, a negative bias was applied to the substrate: The negative biasing current was 10 mA/cm$^2$.

Step 2

Subsequently, the diamond film deposition was continued for 80 hours under the following conditions: the source gas was 0.5% methane, 99.4% hydrogen and 0.1% of oxygen, the gas pressure was 30 Torr, the gas flow rate was 300 ml/min, the substrate temperature was 800° C. As a result, a highly-oriented diamond film with about a 20 µm thickness was obtained. Electron microscopic observation indicated that 98% of this film surface was covered by (100) crystal planes. From electron micrographs of the cross sectional views of the film, the maximum deviation of crystal surface positions was found to be 0.1 µm or less.

Step 3

A P-type semiconducting diamond film was further deposited on the highly-oriented diamond film. The deposition was conducted under the following conditions for 7 hours: the source gas was 0.5% methane, 99.5% hydrogen and 0.5 ppm B$_2$H$_6$, the gas pressure was 30 Torr, the gas flow rate was 300 ml/min, and the substrate temperature was 800° C. As a result, a 1.5 µm thick P-type semiconducting diamond film with the same morphology as that of the underlying highly-oriented diamond film was obtained.

By measuring the hole mobility of the semiconducting diamond film, a value of 95 cm$^2$/V.sec was obtained. This value is about 100 times better than the hole mobility of standard polycrystalline diamond films (about 1 cm$^2$/V.s). The above growth conditions will be referred to as the growth condition A.

Similar experiments were repeated up to Step 2 by changing the growth conditions of Step 1 as follows: the source gas was 3.5% methane and 96.5% hydrogen, the gas pressure was 25 Torr, the gas flow rate was 300 ml/min, and the substrate temperature was 800° C. Other conditions were the same as before. These conditions will be referred to as the growth condition B.

In Step 2, two electron micrographs were taken at +10° and −10° from the film surface normal, and the inclinations of (100) crystal planes were estimated. It was found that the differences in Euler angles between adjacent crystal planes were: |Δα|≦10°, |Δβ|≦10°, and |Δγ|≦10°. After completing Step 3, the hole mobility was measured and a value of 8 cm$^2$/V.s was obtained.

From the above experiments described so far, it was concluded that a high hole mobility is obtained if the Euler angle differences between adjacent crystal surfaces satisfy |Δα|≦10°, |Δβ|≦10°, and |Δγ|≦10°.

The growth conditions for the highly-oriented diamond film 21 in the second embodiment are the same as the growth conditions A, and by further using the growth conditions B, a FET was fabricated, which has the same structure as the second embodiment.

Figure 20:
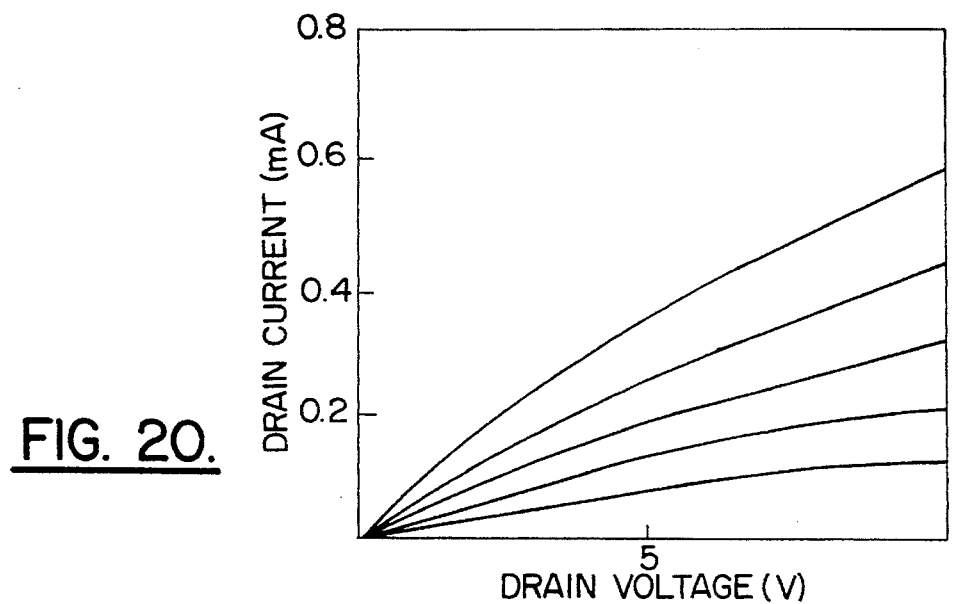
FIG. 20 is a graph showing the drain current-drain voltage characteristics of the highly-oriented diamond FET according to the third embodiment of the present invention.

The current-voltage characteristics of the fabricated FET is shown in FIG. 20. Although the drain current modulation is still observable, the source-drain current becomes smaller than the results shown in FIG. 19. This is perhaps due to the decrease of hole mobility in the third embodiment than in the second embodiment.

What is claimed is;

1. A highly-oriented diamond film field-effect transistor, comprising;

a source electrode, a drain electrode, a gate electrode, a first semiconducting diamond film connected to said source electrode, a second semiconducting diamond film connected to said drain electrode and having the same conductivity type as said first semiconducting diamond film, a highly resistant diamond film connected to said gate electrode and positioned between said first and second semiconducting diamond films, said highly resistant diamond film having a thickness in a direction between said first and second semiconducting diamond films of 10 Å to 1 mm and an electrical resistance of 10$^2$ Ω.cm or more, a channel region being defined within said highly resistant diamond film, said channel region connecting said first and second semiconducting diamond films, and at least part of said first and second semiconducting diamond films and said highly resistant diamond film being made of a highly-oriented diamond film in which at least 80% of a film surface consists of a plurality of diamond crystals with (100) crystal planes, and the differences {Δα, Δβ, Δτ} of the Euler angles {α, β, τ}, which represent the orientations of the crystals with the (100) crystal planes, satisfy |Δα|≦10°, |Δβ|≦10°, and |Δτ|≦10° between adjacent (100) crystal planes.

2. A highly-oriented diamond film field-effect transistor, comprising;

a source electrode, a drain electrode, a gate electrode, a first semiconducting diamond film connected to said source electrode, a second semiconducting diamond film connected to said drain electrode and having the same conductivity type as said first semiconducting diamond film, a highly resistant diamond film connected to said gate electrode and positioned between said first and second semiconducting diamond films, said highly resistant diamond film having a thickness in a direction between said first and second semiconducting diamond films of 10 Å to 1 mm and an electrical resistance of 10$^2$ Ω.cm or more, a channel region being defined within said highly resistant diamond film, said channel region connecting said first and second semiconducting diamond films, and at least part of said first and second semiconducting diamond films and said highly resistant diamond film being made of a highly-oriented diamond film in which at least 80% of a film surface consists of a plurality of diamond crystals with (111) crystal planes, and the differences {Δα, Δβ, Δτ} of the Euler angles {α, β, τ}, which represent the orientations of the crystals with the (111) crystal planes, satisfy |Δα|≦10°, |Δβ|≦10°, and |Δτ|≦10° between adjacent (111) crystal planes.

3. A diamond field-effect transistor according to claim 1 wherein a non-diamond insulating layer is provided between said gate electrode and said highly resistant diamond film.

4. A diamond field-effect transistor according to claim 2 wherein a non-diamond insulating layer is provided between said gate electrode and said highly resistant diamond film.

5. A diamond field-effect transistor according to claim 3 wherein said non-diamond insulating layer is formed of at least one material selected from the group consisting of silicon oxides, silicon nitrides, aluminum oxides, aluminum nitrides and zirconium oxides.

6. A diamond field-effect transistor according to claim 4 wherein said non-diamond insulating layer is formed of at least one material selected from the group consisting of silicon oxides, silicon nitrides, aluminum oxides, aluminum nitrides and zirconium oxides.

* * * * *

UNITED STATES PATENT AND TRADEMARK OFFICE
CERTIFICATE OF CORRECTION

PATENT NO. :    5,491,348
DATED       :    Feb. 13, 1996
INVENTOR(S) :   Koyamao et al.

It is certified that error appears in the above-identified patent and that said Letters Patent is hereby corrected as shown below:

Column 2, line 15, "p31" should be --p.31--.

Column 4, line 39, after "film" insert --3-)--.

line 59, 11c" should be --11C--.
            line 66, "can not" should be --cannot--.
    Column 5, line 47, "a" should be --the--; "the" should be
    --a--.

Column 6, line 35, "11c" should be --11C.

Column 8, line 11, "characteristics" should be
    --characteristic--.

line 31, after "source", omit "the".

line 42, after "in" insert --the--.

Signed and Sealed this

Fifth Day of November, 1996

Attest:

BRUCE LEHMAN

*Attesting Officer*         *Commissioner of Patents and Trademarks*

UNITED STATES PATENT AND TRADEMARK OFFICE
CERTIFICATE OF CORRECTION

PATENT NO. : 5,491,348
DATED : Feb. 13, 1996
INVENTOR(S) : Hisasi Koyamao, et al It is certified that error appears in the above-identified patent and that said Letters Patent is hereby corrected as shown below:

On title page, item [45], insert --*--

On title page, after item [73] insert [*] to read
--The term of this patent shall not extend beyond the expiration date of Pat. No. 5,371,383--

Figure 21:
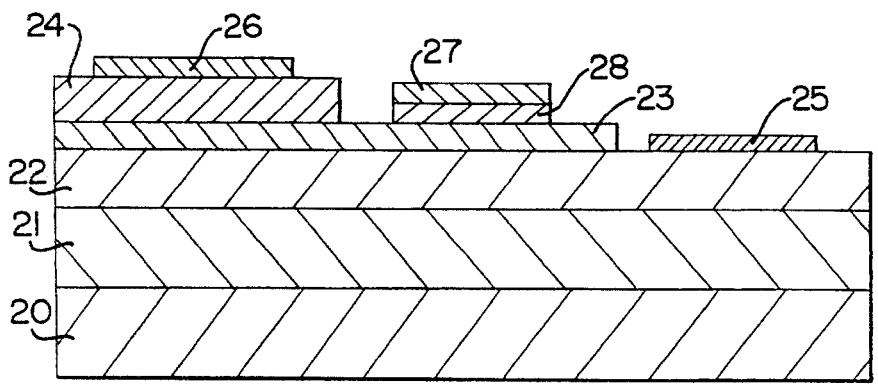
FIG. 21 is a cross sectional view showing a highly-oriented diamond film FET according to a third embodiment of the present invention.

Column 10, after line 6, insert the following paragraph:

--FIG. 21 illustrates another embodiment of the FET according to the invention including a non-diamond insulating layer 28 between the highly resistant diamond layer 23 and the gate electrode 27. The other elements are similar to the FET embodiment show in FIG. 18--.

Signed and Sealed this

Sixth Day of January, 1998

*Attest:*

BRUCE LEHMAN

*Attesting Officer*    Commissioner of Patents and Trademarks